(12) United States Patent
Kim et al.

(10) Patent No.: US 12,094,664 B2
(45) Date of Patent: Sep. 17, 2024

(54) BUTTON COMPOSITE STRUCTURE

(71) Applicant: TOVIS CO., LTD., Incheon (KR)

(72) Inventors: Yong Beom Kim, Incheon (KR); Joon Seog Kim, Gyeonggi-do (KR)

(73) Assignee: TOVIS CO., LTD., Incheon (KR)

( * ) Notice: Subject to any disclaimer, the term of this patent is extended or adjusted under 35 U.S.C. 154(b) by 176 days.

(21) Appl. No.: 17/787,895

(22) PCT Filed: Dec. 31, 2020

(86) PCT No.: PCT/KR2020/019479
§ 371 (c)(1),
(2) Date: Jun. 21, 2022

(87) PCT Pub. No.: WO2021/137653
PCT Pub. Date: Jul. 8, 2021

(65) Prior Publication Data
US 2023/0021789 A1     Jan. 26, 2023

(30) Foreign Application Priority Data

Jan. 3, 2020   (KR) .................... 10-2020-0000593

(51) Int. Cl.
*H01H 13/14*     (2006.01)
*G06F 3/044*     (2006.01)
(Continued)

(52) U.S. Cl.
CPC ........... *H01H 13/14* (2013.01); *G06F 3/0443* (2019.05); *H01H 13/20* (2013.01); *H05K 1/181* (2013.01); *H05K 2201/10053* (2013.01)

(58) Field of Classification Search
CPC .............. H01H 3/12; H01H 9/20; H01H 9/24; H01H 2003/12; H01H 2009/02; H01H 2221/07;
(Continued)

(56) References Cited

U.S. PATENT DOCUMENTS 7,411,142 B2 *   8/2008   Jung ..................... H01H 13/83
                                                         200/314
8,803,014 B2 *   8/2014   Korherr ................ H01H 13/83
                                                         200/314

(Continued)

FOREIGN PATENT DOCUMENTS

EP     3 220 402     9/2017
FR     3 056 469     3/2018
(Continued)

OTHER PUBLICATIONS

Extended European Search Report dated Jan. 2, 2024 for European Patent Application No. 20910337.3.
Office Action for Japanese Patent Application No. 2022-539669 issued on Jul. 25, 2023 and its English Translation by Global Dossier.
(Continued)

*Primary Examiner* — Anthony R Jimenez
(74) *Attorney, Agent, or Firm* — Ladas & Parry, LLP

(57) ABSTRACT

A button composite structure according to an embodiment includes a display panel including a first substrate, a second substrate on the first substrate, and a liquid crystal layer between the first substrate and the second substrate, a member on the second substrate, a first coupling member that couples the display panel and one surface of the member, a button structure disposed on the other surface opposite to the one surface of the member, and a second coupling member that couples the other surface of the member and the button structure. The member includes a third substrate, and the button structure is directly coupled to the third substrate by the second coupling member.

14 Claims, 14 Drawing Sheets

(51) Int. Cl.
*H01H 13/20* (2006.01)
*H05K 1/18* (2006.01)

(58) Field of Classification Search
CPC ....... H01H 2231/016; H01H 2239/006; H01H 2239/074; H01H 13/00; H01H 13/04; H01H 13/06; H01H 13/14; H01H 13/20; H01H 13/50; H01H 13/503; H01H 13/702; H01H 13/705; H05K 1/18; H05K 1/181; H05K 2201/10053; G06F 3/044; G06F 3/0443
USPC ........................................................ 200/341
See application file for complete search history.

(56) References Cited

U.S. PATENT DOCUMENTS

| | | |
|---|---|---|
| 10,210,698 B2 | 2/2019 | Sumi et al. |
| 10,515,508 B2 | 12/2019 | Brandau |
| 11,276,268 B2 | 3/2022 | Lewis et al. |
| 2014/0232325 A1* | 8/2014 | Jung .................. H01H 36/00 307/29 |
| 2019/0080549 A1 | 3/2019 | Lewis et al. |

FOREIGN PATENT DOCUMENTS

| | | |
|---|---|---|
| JP | 62-271039 | 11/1987 |
| JP | 2014-130618 | 7/2014 |
| JP | 2017-097439 | 6/2017 |
| JP | 2018-042767 | 3/2018 |
| JP | 2019-157059 | 9/2019 |
| KR | 10-2007-0013714 | 1/2007 |
| KR | 10-2009-0007229 | 1/2009 |
| KR | 10-2010-0025407 | 3/2010 |
| KR | 10-1940992 | 1/2019 |
| WO | 2014/006756 | 1/2014 |

OTHER PUBLICATIONS

International Search Report for PCT/KR2020/019479 mailed on Apr. 8, 2021 and its English Translation from WIPO (now published as WO 2021/137653).
Written Opinion of the International Searching Authority for for PCT/KR2020/019479 mailed on Apr. 8, 2021 and its English Translation by Google Translate (now published as WO 2021/137653).
Office Action in Korean Application No. 10-2020-0000593, mailed on Jan. 27, 2021, with English Translation by Google Translate.

* cited by examiner

BUTTON COMPOSITE STRUCTURE

CROSS-REFERENCE TO RELATED APPLICATIONS

This application is the national stage of International Patent Application No. PCT/KR2020/019479 filed on Dec. 31, 2020, which claims priority to Korean Patent Application No. 10-2020-0000593 filed in the Korean Intellectual Property Office on Jan. 3, 2020, the disclosures of which are incorporated by reference herein in their entireties.

TECHNICAL FIELD

The present invention relates to a button composite structure.

BACKGROUND ART

Generally, a button structure can be fastened to a deck below a rigid substrate by passing through the rigid substrate formed of glass, quartz, or the like.

However, in a process of drilling a through-hole in the rigid substrate to fasten the button structure to the deck, the rigid substrate may be damaged and cost consumption may not be small, and the degree of freedom in design may be greatly reduced.

Meanwhile, the display panel is disposed on a lower portion of the rigid substrate, and owing to leakage due to the through-hole of the rigid substrate, not only the button structure but also the display panel may be defective.

In addition, the button structure further includes a circuit for receiving a button input signal. When the circuit malfunctions and the button structure is fastened to the deck and is difficult to be separated therefrom, the rigid substrate should be disassembled and the malfunctioning button structure should be separated from the deck. In this case, it is not easy to disassemble the rigid substrate.

DISCLOSURE

Technical Problem

The present invention is directed to providing a button composite structure including a button structure directly stacked on a rigid substrate without forming a through-hole of the rigid substrate.

It should be noted that objects of the present invention are not limited to the above-described objects, and other technical objects of the present invention will be apparent to those skilled in the art from the following description.

Technical Solution

One aspect of the present invention provides a button composite structure including a display panel including a first substrate, a second substrate above the first substrate, and a liquid crystal layer between the first substrate and the second substrate; a member on the second substrate; a first coupling member configured to couple the display panel to one surface of the member; a button structure disposed on the other surface opposite to the one surface of the member; and a second coupling member configured to couple the other surface of the member to the button structure, wherein the member includes a third substrate, and the button structure is directly coupled to the third substrate by the second coupling member.

The button structure may include a button main body fixed to the third substrate, a button circuit fastened to the button main body, and a button connected to the button circuit.

The button main body may include a lock pin, the button circuit may include a lock groove, and the button circuit may be configured to be fastened to the button main body by a method of inserting the lock pin into the lock groove.

The lock pin may be provided as a plurality of lock pins, and the plurality of lock pins may be configured to be separated from the button main body by a method of simultaneously removing the plurality of lock pins from lock grooves using a plurality of unlock pins.

The button circuit may include a circuit board on which a button switch is disposed, the button switch may be in contact with the button, and the button switch may be configured to receive an input signal input to the button.

The button composite structure may include a signal line electrically connected to the circuit board, the signal line may include a first signal line, and the first signal line may be configured to provide the input signal to the display panel.

The signal line may include a second signal line, and the second signal line may be configured to control an on/off of the button switch.

The signal line may extend along the button main body and may be disposed above the third substrate.

The button composite structure may include a light-emitting element disposed on the circuit board, the signal line may include a third signal line, and the light-emitting element may be configured to receive power through the third signal line.

The light-emitting element may be configured to emit light according to the input signal input to the button.

The button composite structure may include a focus variation part disposed on and overlapping the light-emitting element and disposed in the button circuit, and the focus variation part may be configured to vary a focus of the light provided from the light-emitting element.

The button may include a transparent material.

The signal line may extend to pass through the button main body and the third substrate.

The third substrate may include glass, the third substrate may include a glass hole passing therethrough in a thickness direction, the signal line may pass through the glass hole, and the button composite structure may further include a supplementary material surrounding the signal line in the glass hole.

The supplementary material may include a waterproof resin.

The member may further include a touch layer on the third substrate, the touch layer may include the one surface of the member, and the touch layer may be coupled to the display panel by the first coupling member.

The details of other embodiments are included in the detailed description and the accompanying drawings.

Advantageous Effects

In accordance with a button composite structure, since a button structure is directly stacked on a rigid substrate without forming a through-hole in the rigid substrate, it is possible to reduce occurrence of damage to the rigid substrate and costs and increase the degree of freedom in design.

In addition, since the through-hole is not formed, it is possible to reduce failures of a display panel and the button structure due to water leakage.

In addition, since the button structure includes a button main body fixed to the rigid substrate and a button circuit including a circuit, when the circuit fails, only the button circuit can be easily replaced.

The effects according to the embodiments are not limited by the contents exemplified above, and more various effects are included in the present specification.

MODES OF THE INVENTION

Figure 1:
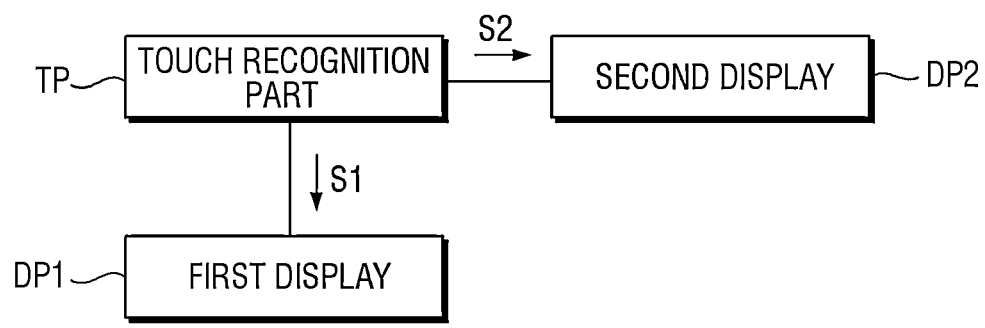
FIG. 1 is a block diagram illustrating a button composite structure according to one embodiment.

Advantages, features, and implementations thereof will be apparent from embodiments which are described in detail below together with the accompanying drawings. The present invention, however, may be implemented in many different forms and should not be construed as being limited to the embodiments set forth herein, and the embodiments are provided such that this disclosure will be thorough and complete and will fully convey the scope of the present invention to those skilled in the art to which the present invention pertains, and the present invention is defined by only the scope of the appended claims.

When an element or layer is referred to as being "on" another element or layer, this includes both cases of being directly on another layer or element or still another element or layer being interposed therebetween. Like reference numerals refer to like components throughout this disclosure.

Although the terms first, second, and the like are used to describe various components, it goes without saying that these components are not limited by these terms. These terms are used only to distinguish one component from another component. Therefore, it goes without saying that a first component described below may be a second component within the technical spirit of the present invention.

Hereinafter, specific embodiments of the present invention will be described with reference to the accompanying drawings.

FIG. 1 is a block diagram illustrating a button composite structure according to one embodiment.

Referring to FIG. 1, the button composite structure according to one embodiment may include a touch recognition part TP, a first display DP1, and a second display DP2.

The touch recognition part TP may serve to recognize a touch input. For example, when a touch input is applied to the button composite structure, the touch recognition part TP may generate touch input signals S1 and S2.

The first display DP1 may include a display panel for displaying an image. A liquid crystal display panel may be applied as the display panel. In the following embodiments, although an example in which a liquid crystal display panel is used as the display panel will be described below, the display panel is not limited thereto, and an electrophoretic display panel, an organic light emission display panel, a micro light-emitting diode (LED) display panel, a plasma display panel, a field emission display panel, a cathode ray display panel, or the like may be applied as the display panel.

The first display DP1 may be electrically connected to the touch recognition part TP. The first display DP1 may receive a touch input signal S1 generated by the touch recognition part TP and display a screen corresponding to the touch input signal S1.

The second display DP2 may include a light-emitting element which emits light. An example of the light-emitting element may include an LED. That is, the second display DP2 may include an LED element. However, the present invention is not limited thereto, and the second display DP2 may include a halogen lamp, an incandescent light bulb, a three-wavelength lamp, or the like.

The second display DP2 may be electrically connected to the touch recognition part TP. The second display DP2 may receive a touch input signal S2 generated by the touch recognition part TP and emit light in response to the touch input signal S2.

In some embodiments, the second display DP2 may emit light regardless of the touch input signal S2 generated by the touch recognition part TP.

Hereinafter, a more detailed structure of the button composite structure according to one embodiment will be described. A reference numeral of each component of the button composite structure described in detail in FIG. 1 is given for convenience of description and may be different from a reference numeral of each component of the button composite structure, which will be described in detail below.

Figure 2:
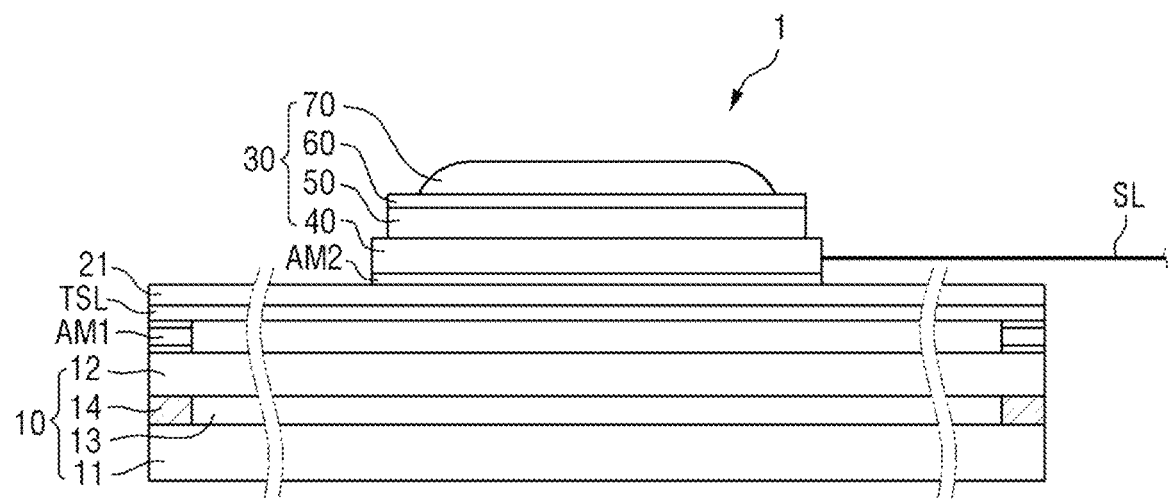
FIG. 2 is a cross-sectional view illustrating the button composite structure according to one embodiment.

FIG. 2 is a cross-sectional view illustrating the button composite structure according to one embodiment.

Referring to FIG. 2, a button composite structure 1 according to one embodiment may include a display panel 10, a member 20, and a button structure 30.

The display panel 10 may include the same structure as the first display DP1 described in detail in FIG. 1.

The display panel 10 may include a first substrate 11, a second substrate 12 facing the first substrate 11, and a liquid crystal layer 13 interposed between the first substrate 11 and the second substrate 12. A sealing member 14 may be disposed on edges of the first substrate 11 and the second substrate 12 and couple the first substrate 11 to the second substrate 12 to prevent liquid crystal molecules of the liquid crystal layer 13 from leaking to the outside.

One of the first substrate 11 and the second substrate 12 may be a thin film transistor substrate, and the other thereof may be a color filter substrate. In the present embodiment, a case in which the first substrate 11 is a thin film transistor substrate and the second substrate 12 is a color filter substrate is exemplified. A display direction may be an outward direction of an upper surface of the second substrate 12. The second substrate 12 may be disposed above the first substrate 11 based on the display direction. Thus, the second substrate 12 may be an upper substrate, and the first substrate 11 may be a lower substrate.

The first substrate 11 and the second substrate 12 may each include an insulating substrate made of glass, quartz, or the like, and structures such as lines, metal layers, semiconductor layers, insulating films, color filters, and black matrices disposed on the insulating substrate. Each structure may be disposed on facing surfaces of the insulating substrate of the first substrate 11 and the insulating substrate of the second substrate 12. In the drawing, for convenience, the illustration of the structure disposed on the insulating substrate is omitted, and only shapes of the insulating substrates of the first substrate 11 and the second substrate 12 are shown. Hereinafter, when referring to a rear shape of the first substrate 11 or the second substrate 12, a corresponding shape may refer to the rear shape of the insulating substrate of the first substrate 11 or the rear shape of the insulating substrate of the second substrate 12.

The member 20 bonded to the display panel 10 may be disposed on the display panel 10.

The member 20 may include a third substrate 21 and a touch layer TSL. The touch layer TSL may be disposed on the third substrate 21. The touch layer TSL may be disposed between the third substrate 21 and the second substrate 12.

A first coupling member AM1 may be disposed between the touch layer TSL and the second substrate 12. The touch layer TSL and the second substrate 12 may be mutually coupled through the first coupling member AM1. The first coupling member AM1 may be double-sided tape, but the present invention is not limited thereto, and a conventional coupling member may be applied as the first coupling member AM1.

The first coupling member AM1 may be disposed at both ends between the touch layer TSL and the second substrate 12. That is, a separation space may be formed between the touch layer TSL and the second substrate 12 in a central portion in which the first coupling member AM1 is not disposed. The touch layer TSL and the second substrate 12 may be disposed apart from each other through the separation space.

The third substrate 21 may be an insulating substrate made of glass, quartz, or the like. The third substrate 21 may include the same material as the first substrate 11. The planar size of the third substrate 21 may be the same as that of the second substrate 12, but the present invention is not limited thereto.

The touch layer TSL may be disposed on one surface of the third substrate 21 facing the second substrate 12.

The touch layer TSL may include a plurality of touch electrodes and a touch insulating layer covering the plurality of touch electrodes. The touch electrode may include a conductive material, and the touch insulating layer may include an inorganic material or an organic material.

The plurality of touch electrodes may be disposed on one surface of the third substrate 21, and the touch insulating layer may be disposed to cover the plurality of touch electrodes.

The touch insulating layer may be in direct contact with the first coupling member AM1. The touch insulating layer may be bonded to the second substrate 12 through the first coupling member AM1.

The touch layer TSL may detect a touch input applied on the other surface of the third substrate 21, which is a surface opposite to the one surface of the third substrate 21. The touch layer TSL may acquire coordinates of a touch input point using a capacitive scheme. In the capacitive scheme, coordinate information on a touched point may be acquired by a self-capacitance method or a mutual capacitance method.

The button structure 30 may be disposed on the member 20. The button structure 30 may be disposed on the other surface of the third substrate 21. That is, the touch layer TSL may be disposed between the button structure 30 and the touch insulating layer, and the member 20 may be disposed between the button structure 30 and the display panel 10.

In some embodiments, the touch layer TSL of the member 20 may be omitted. In this case, the third substrate 21 of the member 20 may be in direct contact with the first coupling member AM1 and may be coupled to the display panel 10 through the first coupling member AM1.

The button structure 30 may include a button main body 40, a button circuit 50, a light emission part 60, and a button 70.

A second coupling member AM2 may be disposed between the button structure 30 and the third substrate 21. The second coupling member AM2 may be a pressure-sensitive adhesive, but the present invention is not limited thereto.

The button main body 40 may be in direct contact with the second coupling member AM2. The button main body 40 may be directly bonded and fixed to the other surface of the third substrate 21 through the second coupling member AM2. The button circuit 50 may be fastened to the button main body 40, and the button 70 may be connected to the button circuit 50.

A signal line SL may be disposed in the button main body 40. The signal line SL may extend along the button main body 40 and pass through one side surface of the button main body 40 to be disposed above the third substrate 21. Although one signal line SL is exemplified in the drawing, a plurality of signal lines SL may be provided according to their functions.

Figure 3:
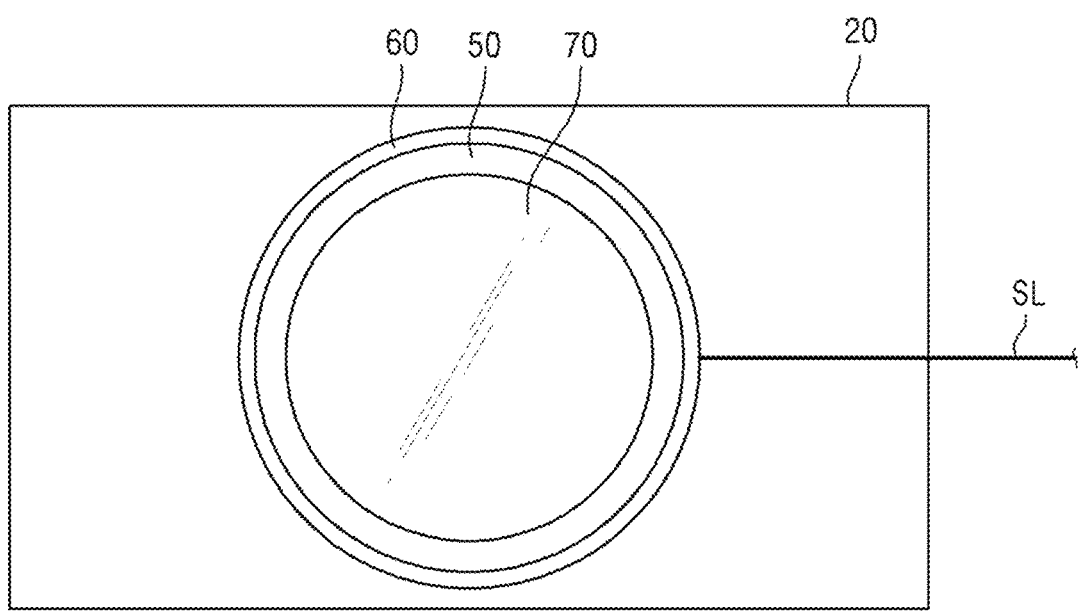
FIG. 3 is a plan view illustrating the button composite structure according to one embodiment.

FIG. 3 is a plan view illustrating the button composite structure according to one embodiment.

Referring to FIG. 3, planar shapes of the button circuit 50 and the light emission part 60 may each include a ring shape including a circular opening. A planar shape of the button 70 may include a circular shape. However, the present invention is not limited thereto, and the planar shape of each of the button circuit 50 and the light emission part 60 is not limited as long as the planar shape includes an opening in a central portion and the opening is surrounded. In addition, the planar shape of the button 70 is not limited thereto and may include a rectangular shape, a square shape, an elliptical shape, or other polygonal shapes.

In the illustrated embodiment, the shape of the opening of the button circuit 50 may be the same as the planar shape of the button 70. However, the present invention is not limited thereto, and the shape of the opening of the button circuit 50 may be different from the planar shape of the button 70.

Figure 4:
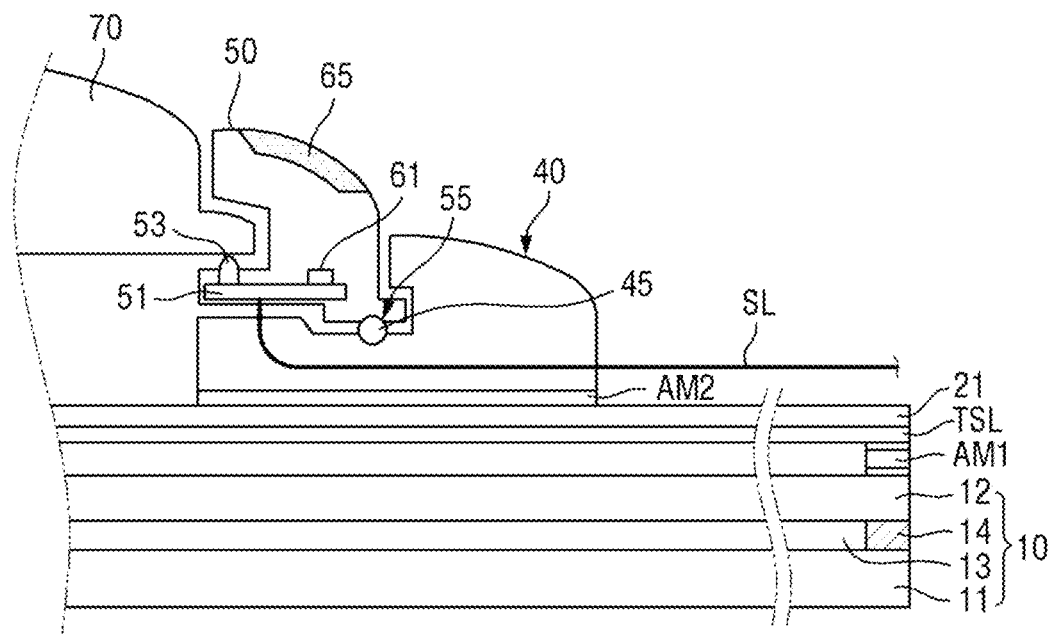
FIG. 4 is a cross-sectional view illustrating the button composite structure according to one embodiment.

FIG. 4 is a cross-sectional view illustrating the button composite structure according to one embodiment.

Referring to FIG. 4, the button main body 40 is not limited thereto and may include a left and right inverted "L" cross-sectional shape. Here, the button main body 40 may be divided into a first portion forming a lower line of the left and right inverted "L" cross-sectional shape, and a second portion protruding from the first portion. A lock pin 45 may be disposed in the first portion of the button main body 40. The lock pin 45 may protrude from the first portion of the button main body 40 in a thickness direction.

The button circuit 50 may be disposed on the button main body 40. The button circuit 50 may be disposed on an upper portion and a left side of the first portion of the button main body 40.

A lock groove 55 may be disposed in a lower surface of the button main body 40. The lock groove 55 may include a shape recessed upward from the lower surface of the button main body 40.

The button circuit 50 may have a locked/unlocked relationship with the button main body 40 by a method of inserting the lock pin 45 into the lock groove 55. That is, when the lock pin 45 is inserted into the lock groove 55, the button circuit 50 may have a fastening relationship (a locked state) with the button main body 40, and when the lock pin 45 is removed from the lock groove 55, the button circuit 50 may have a separation relationship (an unlocked state) with the button main body 40.

The insertion/separation relationship between the lock groove 55 and the lock pin 45 will be described below with reference to FIGS. 5 to 9.

The button circuit 50 may include a circuit board 51. A button switch 53 and a light-emitting element 61 of the light emission part 60 may be disposed on the circuit board 51. The light emission part 60 may have the same configuration as the second display DP2 described in detail in FIG. 1.

An example of the light-emitting element 61 may include an LED. That is, the light-emitting element 61 may include an LED element. However, the present invention is not limited thereto, and the light-emitting element 61 may include a halogen lamp, an incandescent light bulb, a three-wavelength lamp, or the like.

The circuit board 51 may be electrically connected to the signal line SL of the button main body 40 to form a contact point.

The button switch 53 is disposed on the circuit board 51 and may be disposed to protrude from a surface of the button circuit 50.

The button 70 may be disposed on a side surface of the button circuit 50 and disposed on an upper portion of the button switch 53 of the button circuit 50. The button 70 may be in direct contact with the button switch 53.

The button 70 may include a transparent material.

A focus variation part 65 may be further disposed on an upper surface of the light emission part 60 of the button circuit 50 in an upward direction.

The focus variation part 65 may be disposed to overlap the light-emitting element 61 in the thickness direction.

The focus variation part 65 may serve to variably control the focus of light emitted from the light-emitting element 61. For example, the focus variation part 65 may include an optical lens.

Hereinafter, the operation of the button composite structure 1 will be described in more detail.

A physical touch signal may be input through the button 70. Hereinafter, the physical touch signal will be referred to as an input signal. The button switch 53 may be configured to receive an input signal input to the button 70.

The plurality of signal lines SL may include a first signal line, a second signal line, a third signal line, and a fourth signal line.

The second signal line among the plurality of signal lines SL may be configured to provide the display panel 10 with an input signal input to the button 70. That is, the second signal line is electrically connected to the display panel 10, and when a touch input is detected by the button 70, the display panel 10 may output a specific screen.

The second signal line among the plurality of signal lines SL may be configured to control an on/off of the button switch 53. The second signal line may be a line for supplying power to the button switch 53 regardless of the input signal input to the button 70.

The light-emitting element 61 may be configured to receive power through the third signal line among the signal lines SL. That is, power may be supplied to the light-emitting element 61 through the third signal line.

The light-emitting element 61 may be configured to emit light according to the input signal input to the button 70. In this case, the fourth signal line among the plurality of signal lines SL may serve to transmit the input signal, which is input to the button 70, to a main controller and transmit a signal for controlling a light emitting event of the light-emitting element 61 from the main controller to the light-emitting element 61 of the circuit board 51.

In some embodiments, the fourth signal line is omitted, and when an input signal is generated at the button 70 through the button switch 53, the light-emitting element 61 may directly emit light through the circuit board 51.

Figure 5A:
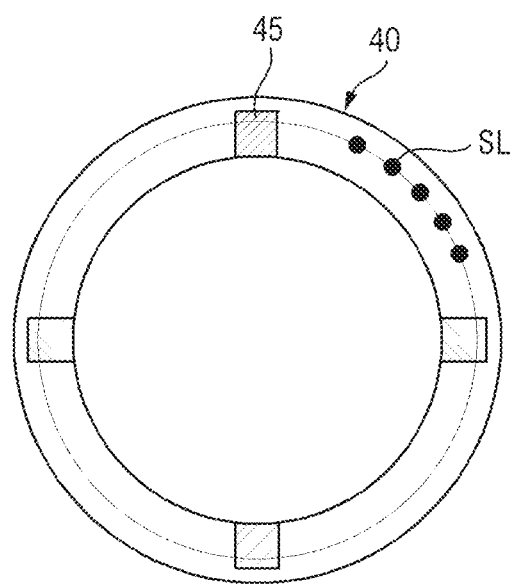
FIG. 5 is a plan view illustrating a button main body and a button circuit according to one embodiment.
Figure 5B:
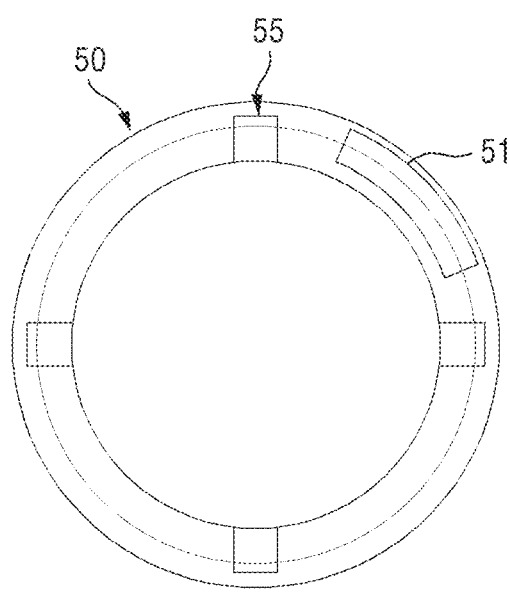
Figure 6:
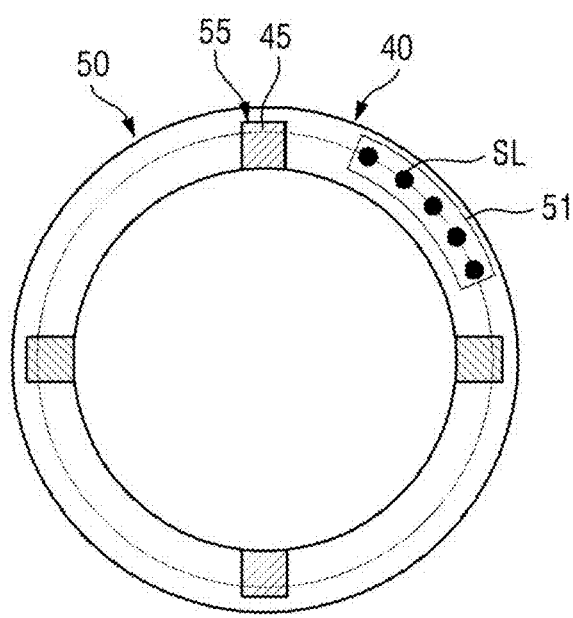
FIG. 6 is a plan view illustrating a state in which the button main body and the button circuit are fastened according to one embodiment.
Figure 7:
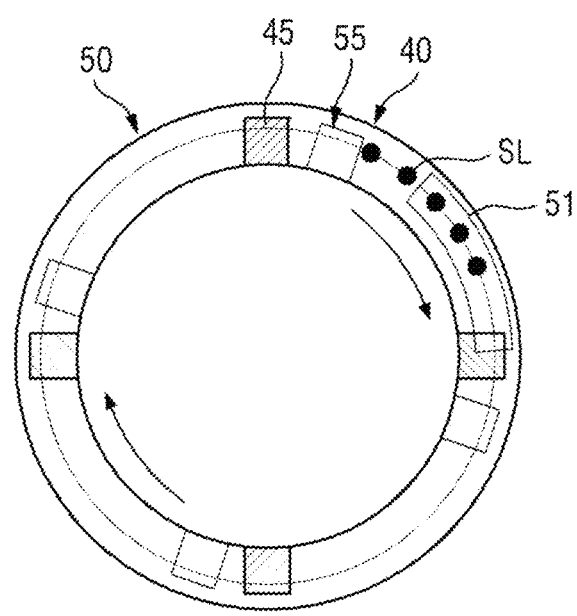
FIG. 7 is a plan view illustrating a state in which the button main body and the button circuit are disassembled according to one embodiment.
Figure 8:
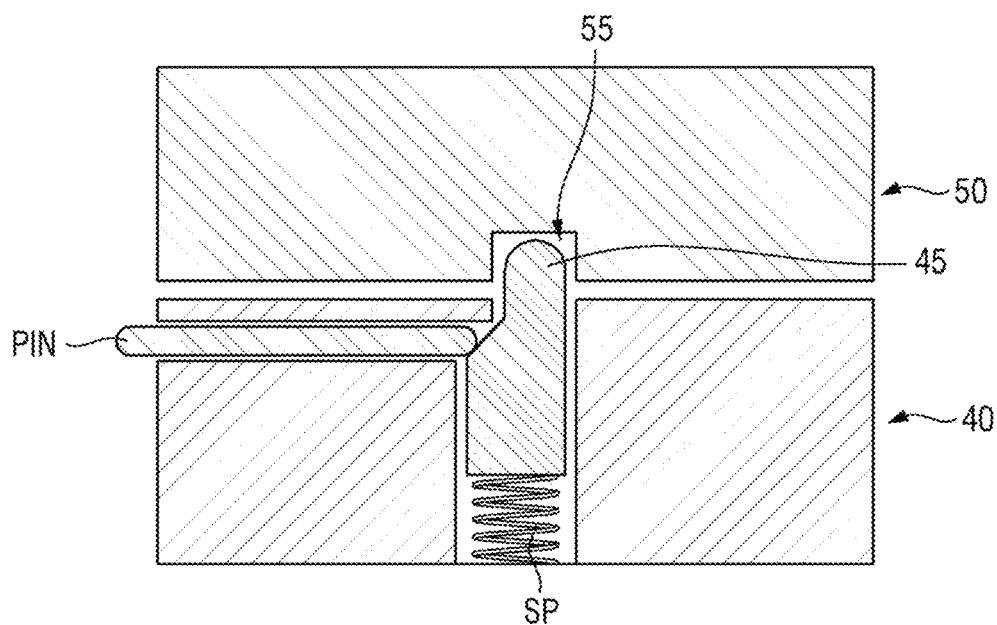
FIG. 8 is a cross-sectional view illustrating a state in which the button main body and the button circuit are fastened according to one embodiment.
Figure 9:
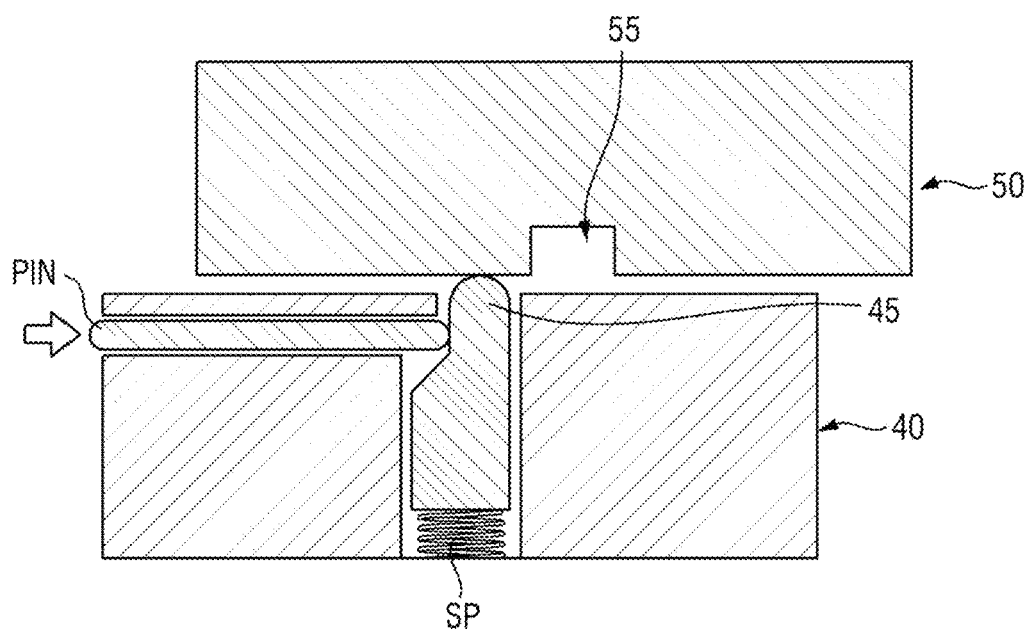
FIG. 9 is a cross-sectional view illustrating a state in which the button main body and the button circuit are disassembled according to one embodiment.

FIG. 5 is a plan view illustrating a button main body and a button circuit according to one embodiment. FIG. 6 is a plan view illustrating a state in which the button main body and the button circuit are fastened according to one embodiment. FIG. 7 is a plan view illustrating a state in which the button main body and the button circuit are disassembled according to one embodiment. FIG. 8 is a cross-sectional view illustrating a state in which the button main body and the button circuit are fastened according to one embodiment. FIG. 9 is a cross-sectional view illustrating a state in which the button main body and the button circuit are disassembled according to one embodiment.

First, referring to FIG. 5, the lock pin 45 of the button main body 40 may be provided as a plurality of lock pins 45. An arrangement of the lock pin 45 illustrated in the drawings is not limited thereto.

The lock groove 55 of the button circuit 50 may be provided as a plurality of lock grooves 55. In one embodiment, the number of the lock grooves 55 may be the same as the number of the lock pins 45.

Referring to FIG. 6, the plurality of lock pins 45 may overlap the plurality of lock grooves 55 in the thickness direction.

The lock pin 45 protruding from the surface of the button main body 40 in the thickness direction may be inserted into the lock groove 55 recessed upward from the lower surface of the button main body 40. Each of the plurality of lock pins 45 may be inserted into a corresponding lock groove 55 in the thickness direction.

In this way, the button circuit 50 may have a locked/unlocked relationship with the button main body 40 by a method of inserting the lock pin 45 into the lock groove 55.

The lock pin 45 may include an insertion part inserted into the lock groove 55, a body connected to a lower portion of the insertion part, and an elastic part SP connected to a lower portion of the body. In a cross-sectional view, a width of the insertion part may be smaller than a width of the body and a width of the elastic part SP. A portion of the body protruding to one side from the insertion part may have an inclined shape in the cross-sectional view.

Referring to FIG. 7, as in the embodiment of FIG. 6, the button circuit 50 coupled to the button main body 40 may be rotated in a clockwise direction (as illustrated in the drawing) or in a counterclockwise direction to separate the button circuit 50 from the button main body 40. However, due to the lock pin 45 inserted into the lock groove 55, even when the button circuit 50 is rotated, the lock pin 45 cannot be easily removed from the lock groove 55.

Referring to FIGS. 8 and 9, the button circuit 50 may be separated from the button main body 40 by a method of removing the lock pin 45 from the lock groove 55 using an unlock pin.

That is, the unlock pin PIN may press the portion, which is inclined and protrudes to one side from the insertion part of the body of the lock pin 45, in a direction opposite to the one side to withdraw the insertion part of the lock pin 45 from the lock groove 55.

As described above, the lock pin 45 according to one embodiment further includes the elastic part SP connected to the lower portion of the body, and the elastic part SP may include a spring. When the portion, which is inclined and protrudes to one side from the insertion part of the body of the lock pin 45, is pressed in the direction opposite to the one side through the unlock pin PIN, the elastic part SP may serve to allow the lock pin 45 to be easily moved in a downward direction, thereby allowing the insertion part to be easily removed from the lock groove 55.

According to one embodiment, since the plurality of lock grooves 55 and the plurality of lock pins 45 correspond to each other, the button main body 40 and the button circuit 50 may be completely separated only when the plurality of lock pins 45 are simultaneously moved downward.

That is, the button circuit 50 may be completely separated from the button main body 40 by a method of simultaneously removing the plurality of lock pins 45 from the plurality of lock grooves 55 using a plurality of unlock pins PIN.

When the insertion part is removed from the lock groove 55 as shown in FIG. 9, as described above in FIG. 7, the button circuit 50 coupled to the button main body 40 may be rotated in a clockwise direction (as illustrated in the drawing) or in a counterclockwise direction to separate the button circuit 50 from the button main body 40.

When the button structure passes through the third substrate and is fastened to the deck below the third substrate, in a process of drilling a through-hole in the third substrate so as to fasten the button structure to the deck, damage to the third substrate may occur, cost consumption is not small, and the degree of freedom in design can be greatly reduced.

However, in accordance with the button composite structure 1 according to one embodiment, since the button structure 30 is directly stacked on the third substrate 21 without forming the through-hole in the third substrate 21, it is possible to reduce occurrence of damage to the third substrate 21, reduce costs, and increase the degree of freedom in design.

In addition, when the button structure is fastened to the deck of the lower portion of the third substrate through the through-hole of the third substrate, due to water leakage resulting from the through-hole of the third substrate, the button structure and the display panel can be defective.

However, in the case of the button composite structure 1 according to one embodiment, since the through-hole is not formed in the third substrate 21, it is possible to reduce failures of the display panel 10 and the button structure 30 due to water leakage.

In addition, the button structure further includes a circuit for receiving a button input signal. When the circuit malfunctions and the button structure is fastened to the deck and is difficult to be separated therefrom, the third substrate should be disassembled and the malfunctioning button structure should be separated from the deck. In this case, since disassembly work of the third substrate is not easy, a lot of time to repair the button structure can be consumed.

However, in accordance with the button composite structure 1 according to one embodiment, the button main body 40, which does not include the circuit including the circuit board 51, is fixed to the third substrate 21, and the button circuit 50 including the circuit is locked/unlocked with the button main body 40. Thereby, when the circuit fails, only the button circuit 50 can be easily replaced, and thus the repair of the button structure can be performed in a short time.

In addition, the lock groove 55 and the lock pin 45, which correspond to each other, of the button composite structure 1 according to one embodiment are provided as the plurality of lock grooves 55 and the plurality of lock pins 45, and since the button circuit 50 should be completely separated from the button main body 40 by a method of simultaneously removing the plurality of lock pins 45 from the plurality of lock grooves 55 using the plurality of unlock pins PIN, it is possible to easily prevent the button main body 40 and the button 70 from being lost.

Hereinafter, another embodiment will be described. In the following embodiment, the same reference numerals will be assigned to components which are the same as the above-described components, and duplicate descriptions thereof will be omitted or simplified herein.

Figure 10:
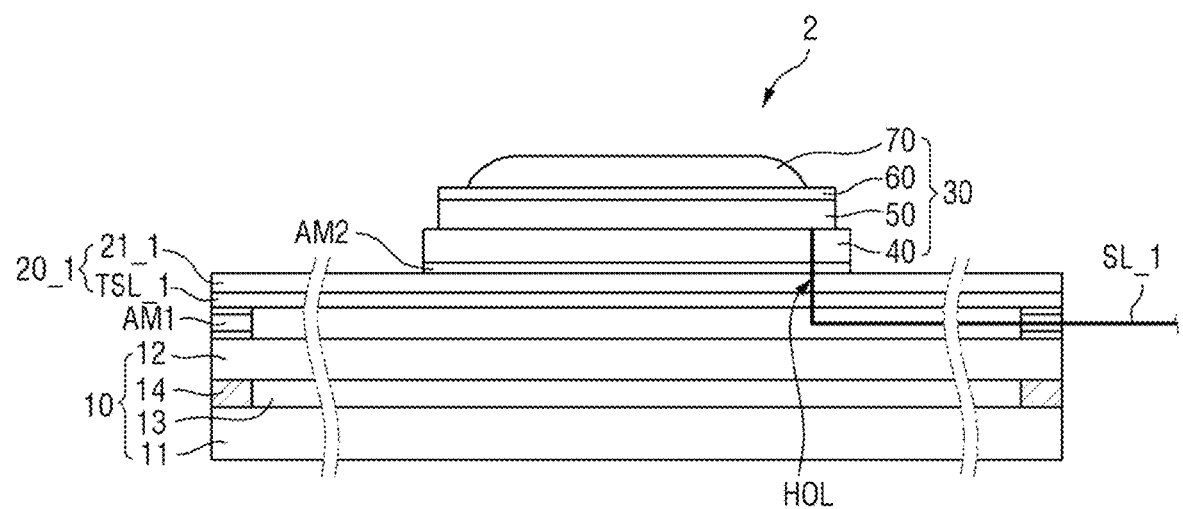
FIG. 10 is a cross-sectional view illustrating a button composite structure according to another embodiment.
Figure 11:
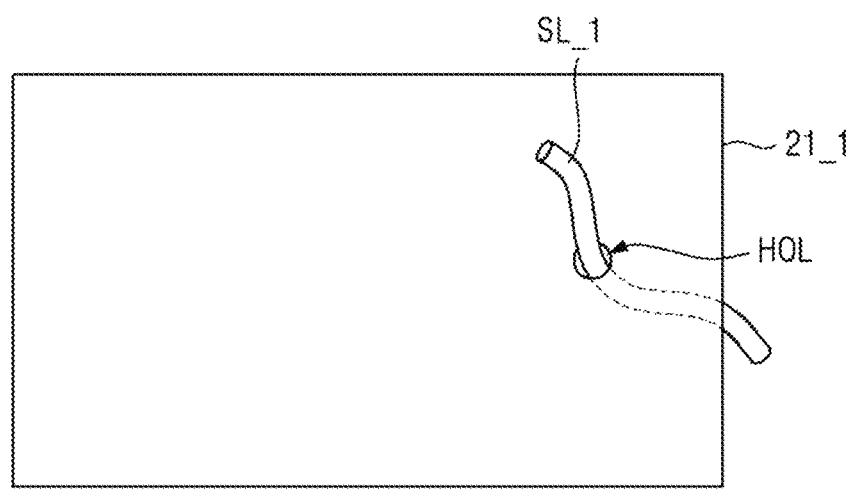
FIG. 11 is a plan view illustrating a signal line and a third substrate according to another embodiment.

FIG. 10 is a cross-sectional view illustrating a button composite structure according to another embodiment. FIG. 11 is a plan view illustrating a signal line and a third substrate according to another embodiment.

Referring to FIGS. 10 and 11, a structure of a button composite structure 2 according to the present embodiment is different from the structure of the button composite structure 1 according to one embodiment in that a signal line SL_1 passes through a lower surface of a button main body 40 and a second coupling member AM2, extends to completely pass through a member 20_1, and bends and extends to pass through a first coupling member AM1.

To describe in more detail, in the button composite structure 2 according to the present embodiment, the signal line SL_1 passes through the lower surface of the button main body 40 and the second coupling member AM2, extends to completely pass through the member 20_1, and bands and extends to pass through the first coupling member AM1 to extend.

That is, the signal line SL_1 may be further disposed between the member 20_1 and a display panel 10. Since the signal line SL_1 completely passes through the second member 20_1, a third substrate 21_1 of the second member 20_1 and a touch layer TSL_1 may each include a through-hole HOL overlapping in the thickness direction.

In the present embodiment, in a plan view, a size of the through-hole HOL may be slightly larger than or substantially the same as a size of the signal line SL1.

Other descriptions have been described with reference to FIGS. 1 to 9, and thus a duplicate description will be omitted below.

Figure 12:
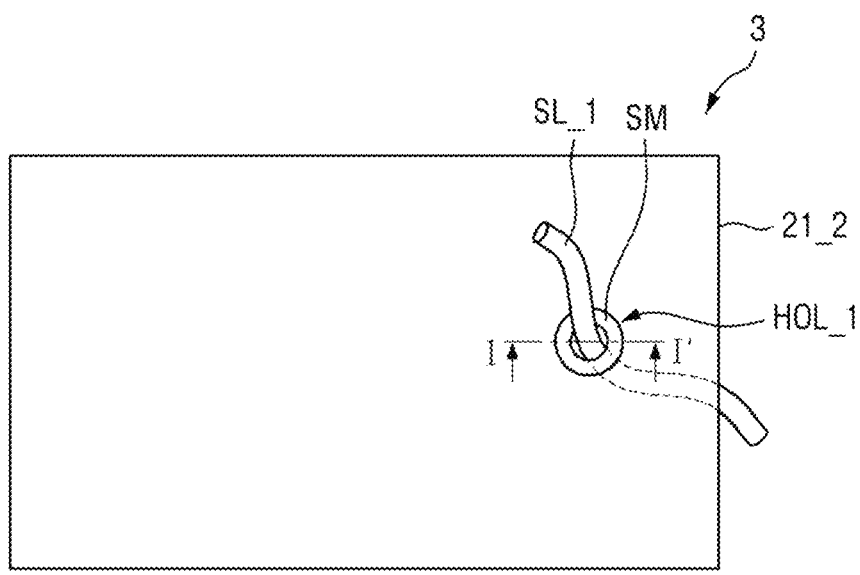
FIG. 12 is a plan view illustrating a signal line and a third substrate according to still another embodiment.
Figure 13:
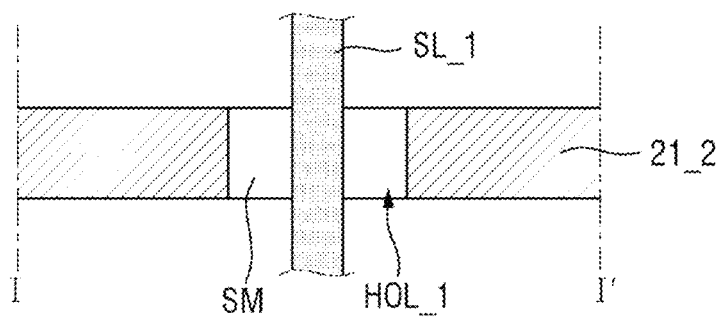
FIG. 13 is a cross-sectional view illustrating the signal line and the third substrate according to still another embodiment.

FIG. 12 is a plan view illustrating a signal line and a third substrate according to still another embodiment. FIG. 13 is a cross-sectional view illustrating the signal line and the third substrate according to still another embodiment.

Referring to FIGS. 12 and 13, a button composite structure 3 according to the present embodiment is different from the button composite structure 2 according to FIGS. 11 and 12 in that a through-hole HOL_1 of a third substrate 21_2 is formed to be larger than the through-hole HOL according to FIGS. 11 and 12, and a supplementary material SM surrounding the signal line SL_1 in the through-hole HOL_1 is further included.

To describe in more detail, in the button composite structure 3 according to the present embodiment, the through-hole HOL_1 of the third substrate 21_2 may be formed to be larger than the through-hole HOL according to FIGS. 11 and 12, and the supplementary material SM surrounding the signal line SL_1 in the through-hole HOL_1 may be further included.

The supplementary material SM may be disposed between an inner wall (or an inner surface) of the third substrate 21_2 constituting the through-hole HOL_1 and the signal line SL1. The supplementary material SM may be in direct contact with the inner wall (or the inner surface) of the third substrate 21_2 and the signal line SL1.

Although not shown in the drawings, the supplementary material SM may be further disposed between the inner wall (or the inner surface) of the touch layer constituting the through-hole HOL_1 and the signal line SL1.

The supplementary material SM may include a resin having a waterproof function, and the supplementary material SM is not limited as long as it is a material having a waterproof function.

While embodiments of the present invention have been described with reference to the accompanying drawings, those skilled in the art can understand that the present invention can be implemented in other specific forms without departing from the technical spirit or the necessary features of the present invention. Therefore, it should be understood that the above-described embodiments are not restrictive but illustrative in all aspects.

DESCRIPTION OF REFERENCE NUMERALS

1: button composite structure
10: display panel
30: button structure

The invention claimed is:

1. A button composite structure comprising:
a display panel including a first substrate, a second substrate above the first substrate, and a liquid crystal layer between the first substrate and the second substrate;
a third substrate on the second substrate;
a first coupling member configured to couple the display panel to one surface of the third substrate;
a button structure disposed on an other surface opposite to the one surface of the third substrate; and
a second coupling member configured to couple the other surface of the third substrate to the button structure,
wherein the button structure is directly coupled to the third substrate by the second coupling member, and
wherein the button structure includes:
a button main body fixed to the third substrate;
a button circuit fastened to the button main body; and
a button connected to the button circuit, and
wherein:
the button main body includes a lock pin;
the button circuit includes a lock groove; and
the button circuit is configured to be fastened to the button main body by a method of inserting the lock pin into the lock groove.

2. The button composite structure of claim 1, further including a touch layer on the third substrate, and wherein the touch layer is coupled to the display panel by the first coupling member.

3. The button composite structure of claim 1, wherein the button includes a transparent material.

4. The button composite structure of claim 1, wherein:
the lock pin is provided as a plurality of lock pins;
locking grooves include the lock groove; and
the plurality of lock pins are configured to be separated from the button main body by a method of simultaneously removing the plurality of lock pins from lock grooves using a plurality of unlock pins.

5. The button composite structure of claim 1, wherein:
the button circuit includes a circuit board on which a button switch is disposed;
the button switch is in contact with the button; and
the button switch is configured to receive an input signal input to the button.

6. The button composite structure of claim 5, comprising:
a signal line electrically connected to the circuit board;
wherein the signal line includes a first signal line; and
the first signal line is configured to provide the input signal to the display panel.

7. The button composite structure of claim 6, wherein:
the signal line includes a second signal line; and
the second signal line is configured to control an on/off of the button switch.

8. The button composite structure of claim 6, wherein the signal line extends along the button main body and is disposed above the third substrate.

9. The button composite structure of claim 8, further comprising a light-emitting element disposed on the circuit board,
wherein the signal line includes a third signal line, and
the light-emitting element is configured to receive power through the third signal line.

10. The button composite structure of claim 9, wherein the light-emitting element is configured to emit light according to the input signal input to the button.

11. The button composite structure of claim 10, further comprising a focus variation part disposed on and overlapping the light-emitting element and disposed in the button circuit,
wherein the focus variation part is configured to vary a focus of the light provided from the light-emitting element.

12. The button composite structure of claim 6, wherein the signal line extends to pass through the button main body and the third substrate.

13. The button composite structure of claim 12, wherein:
the third substrate includes glass;
the third substrate includes a glass hole passing therethrough in a thickness direction; and
the signal line passes through the glass hole,
wherein the button composite structure further includes a supplementary material surrounding the signal line in the glass hole.

14. The button composite structure of claim 13, wherein the supplementary material includes a waterproof resin.

* * * * *